(12) United States Patent
Takemura et al.

(10) Patent No.: US 8,969,854 B2
(45) Date of Patent: Mar. 3, 2015

(54) LIGHT-EMITTING LAYER AND LIGHT-EMITTING ELEMENT

(75) Inventors: Yasuhiko Takemura, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 108 days.

(21) Appl. No.: 13/405,384

(22) Filed: Feb. 27, 2012

(65) Prior Publication Data

US 2012/0217486 A1 Aug. 30, 2012

(30) Foreign Application Priority Data

Feb. 28, 2011 (JP) ................................ 2011-041233

(51) Int. Cl.
*H01L 29/08* (2006.01)
*H01L 35/24* (2006.01)
(Continued)

(52) U.S. Cl.
CPC ............. *B82Y 20/00* (2013.01); *H01L 51/5012* (2013.01); *H01L 2251/552* (2013.01); *H01L 2251/558* (2013.01)
USPC .......... 257/40; 257/88; 257/89; 257/E51.018; 257/103

(58) Field of Classification Search
CPC ................ H01L 51/00; H01L 51/5203; H01L 2251/552; H01L 51/5012
USPC .......... 257/40, 88, 89, E51.018, 103; 349/70; 313/504
See application file for complete search history.

(56) References Cited

U.S. PATENT DOCUMENTS

| 6,911,271 B1 | 6/2005 | Lamansky et al. |
| 6,936,961 B2 * | 8/2005 | Liao et al. ................... 313/506 |

(Continued)

FOREIGN PATENT DOCUMENTS

| EP | 1202608 A | 5/2002 |
| EP | 1424350 A | 6/2004 |

(Continued)

OTHER PUBLICATIONS

Baldo et al. "Very high-efficiency green organic light-emitting devices based on electrophosphorescence", Applied Physics Letters, Jul. 5, 1999, vol. 75, No. 1, pp. 4-6.

(Continued)

*Primary Examiner* — Telly Green
(74) *Attorney, Agent, or Firm* — Eric J. Robinson; Robinson Intellectual Property Law Office, P.C.

(57) ABSTRACT

To provide a highly efficient organic light-emitting element. An extremely thin layer (a monomolecular film or the like) containing an organic light-emitting material such as an iridium complex is provided between a layer of an n-type organic material (an organic material having a high electron-transport property) and a layer of a p-type organic material (an organic material having a high hole-transport property). In a structure described above, in a layer of the organic light-emitting material, electrons are injected from the LUMO of the n-type organic material to the LUMO of the organic light-emitting material, and holes are injected from the HOMO of the p-type organic material to the HOMO of the organic light-emitting material, whereby the organic light-emitting material is brought into an excited state and emits light.

17 Claims, 4 Drawing Sheets

(51) Int. Cl.
*H01L 51/00* (2006.01)
*B82Y 20/00* (2011.01)
*H01L 51/50* (2006.01)

(56) References Cited

U.S. PATENT DOCUMENTS

| | | | |
|---|---|---|---|
| 6,939,624 B2 | 9/2005 | Lamansky et al. | |
| 7,250,226 B2 | 7/2007 | Tokito et al. | |
| 7,273,663 B2 * | 9/2007 | Liao et al. | 428/690 |
| 7,381,479 B2 | 6/2008 | Lamansky et al. | |
| 7,553,560 B2 | 6/2009 | Lamansky et al. | |
| 7,572,522 B2 | 8/2009 | Seo et al. | |
| 7,601,439 B2 | 10/2009 | Chun et al. | |
| 7,771,844 B2 | 8/2010 | Inoue et al. | |
| 7,943,925 B2 | 5/2011 | Yamazaki | |
| 8,048,536 B2 | 11/2011 | Isobe | |
| 8,247,086 B2 | 8/2012 | Inoue et al. | |
| 2003/0015960 A1 | 1/2003 | Seo et al. | |
| 2003/0205696 A1 | 11/2003 | Thoms et al. | |
| 2004/0183082 A1 | 9/2004 | Yamazaki | |
| 2004/0227460 A1 * | 11/2004 | Liao et al. | 313/506 |
| 2005/0048310 A1 | 3/2005 | Cocchi et al. | |
| 2005/0145830 A1 | 7/2005 | Sakakibara et al. | |
| 2005/0196775 A1 | 9/2005 | Swager et al. | |
| 2006/0040132 A1 * | 2/2006 | Liao et al. | 428/690 |
| 2006/0087225 A1 * | 4/2006 | Liao et al. | 313/504 |
| 2006/0228577 A1 | 10/2006 | Nagara | |
| 2007/0145885 A1 | 6/2007 | Tadokoro et al. | |
| 2007/0222374 A1 | 9/2007 | Egawa et al. | |
| 2007/0244320 A1 | 10/2007 | Inoue et al. | |
| 2008/0160345 A1 | 7/2008 | Inoue et al. | |
| 2008/0281098 A1 | 11/2008 | Lamansky et al. | |
| 2008/0286604 A1 | 11/2008 | Inoue et al. | |
| 2009/0136877 A1 * | 5/2009 | Suganuma | 430/325 |
| 2010/0007270 A1 * | 1/2010 | Suh | 313/504 |
| 2010/0052527 A1 | 3/2010 | Ikeda et al. | |
| 2011/0001146 A1 | 1/2011 | Yamazaki et al. | |
| 2011/0101319 A1 * | 5/2011 | Fukumatsu et al. | 257/40 |
| 2011/0210316 A1 | 9/2011 | Kadoma et al. | |
| 2011/0215714 A1 | 9/2011 | Seo et al. | |
| 2012/0025172 A1 * | 2/2012 | Smigelski et al. | 257/40 |
| 2012/0098417 A1 | 4/2012 | Inoue et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0217487 A1 | 8/2012 | Yamazaki et al. | |
| 2012/0242219 A1 | 9/2012 | Seo et al. | |
| 2012/0248421 A1 | 10/2012 | Yamazaki et al. | |
| 2012/0256535 A1 | 10/2012 | Seo et al. | |
| 2013/0048964 A1 | 2/2013 | Takeda et al. | |

FOREIGN PATENT DOCUMENTS

| | | |
|---|---|---|
| EP | 1516901 A | 3/2005 |
| EP | 2154165 A | 2/2010 |
| JP | 2005-015508 A | 1/2005 |
| JP | 2005-158520 A | 6/2005 |
| JP | 2006-182775 A | 7/2006 |
| JP | 2007-042875 A | 2/2007 |
| JP | 2007-214465 A | 8/2007 |
| JP | 2008-247810 A | 10/2008 |
| JP | 2012-004526 A | 1/2012 |
| JP | 2012-044125 A | 3/2012 |
| WO | WO 00/70655 | 11/2000 |

OTHER PUBLICATIONS

Choong et al. "Organic light-emitting diodes with a bipolar transport layer," Applied Physics Letters, Jul. 12, 1999, vol. 75, No. 2, pp. 172-174.

Itano et al. "Exciplex formation at the organic solid-state interface: Yellow emission in organic light-emitting diodes using green-fluorescent tris(8-quinolinolato)aluminum and hole-transporting molecular materials with low ionization potentials," Applied Physics Letters, Feb. 9, 1998, vol. 72, No. 6, pp. 636-638.

Tokito et al., "Confinement of Triplet Energy on Phosphorescent Molecules for Highly-Efficient Organic Blue-Light-Emitting Devices," Applied Physics Letters, vol. 83, No. 3, pp. 569-571, Jul. 21, 2003.

Yang, "Charge carriers at organic heterojunction interface: Exciplex emission or electroplex emission?" Journal of Appllied Physics, vol. 101, pp. 096101-1096101-3, 2007.

Baldo.M et al., "Highly Efficient Phosphorescent Emission From Organic Electroluminescent Devices,", Nature, Sep. 10, 1998, vol. 395, pp. 151-154.

Gu.G et al., "Transparent Organic Light Emitting Devices,", Appl. Phys. Lett. (Applied Physics Letters), May 6, 1996, vol. 68, No. 19, pp. 2606-2608.

Adachi.C et al., "Nearly 100 % Internal Phosphorescence Efficiency in an Organic Light Emitting Device,", J. Appl. Phys. (Journal of Applied Physics), Nov. 15, 2001, vol. 90, No. 10, pp. 5048-5051.

Baldo.M et al., "Prospects for Electrically Pumped Organic Lasers,", Phys. Rev. B (Physical Review. B), Jul. 1, 2002, vol. 66, pp. 035321-1-035321-16.

Markham.J et al., "High-efficiency green phosphorescence from spin-coated single-layer dendrimer light-emitting diodes,", Appl. Phys. Lett. (Applied Physics Letters), Apr. 15, 2002, vol. 80, No. 15, pp. 2645-2647.

International Search Report (Application No. PCT/JP2012/053441) Dated Mar. 13, 2012.

Written Opinion (Application No. PCT/JP2012/053441) Dated Mar. 13, 2012.

Kondakova.M et al., "High-efficiency, low-voltage phosphorescent organic light-emitting diode devices with mixed host,", J. Appl. Phys. (Journal of Applied Physics), 2008, vol. 104, pp. 094501-1-094501-17.

Seo.J et al., "Efficient blue-green organic light-emitting diodes based on heteroleptic tris-cyclometalated iridium(III) complexes,", Thin Solid Films, 2009, vol. 517, No. 5, pp. 1807-1810.

International Search Report (Application No. PCT/JP2012/053200) Dated May 22, 2012.

Written Opinion (Application No. PCT/JP2012/053200) Dated May 22, 2012.

International Search Report (Application No. PCT/JP2012/053202) Dated May 22, 2012.

Written Opinion (Application No. PCT/JP2012/053202) Dated May 22, 2012.

Fujita.M et al., "Reduction of operating voltage in organic light-emitting diode by corrugated photonic crystal structure,", Appl. Phys. Lett. (Applied Physics Letters), Dec. 6, 2004, vol. 85, No. 23, pp. 5769-5771.

\* cited by examiner

LIGHT-EMITTING LAYER AND LIGHT-EMITTING ELEMENT

BACKGROUND OF THE INVENTION

1. Field of the Invention

The present invention relates to carrier-injection organic electroluminescence (EL).

2. Description of the Related Art

Products to which a carrier-injection organic EL light-emitting phenomenon is applied are being put to practical use (for example, see Patent Document 1). There are generally two excited states a light-emitting material can be in, which are a singlet excited state and a triplet excited state, and the former is considered to be probabilistically about one-third of the latter.

The ground state of a light-emitting material is a singlet state, and for ordinary organic molecules, the transition from the singlet excited state to the ground state is possible, but the transition from the triplet excited state to the ground state is forbidden. In other words, although light emission can be obtained through the transition from the singlet excited state to the ground state, in many cases, transition from the triplet excited state to the ground state accompanied by light emission does not occur, and the transition from the triplet excited state to the ground state is made via various levels. In that process, energy is released as heat. Such a phenomenon is called thermal deactivation.

As described above, the probability of being in the singlet excited state is one-third of that of being in the triplet excited state. Therefore, much of energy given to the light-emitting material is lost as heat, which results in poor efficiency. In addition, a large amount of heat is generated, which causes deterioration of an organic material.

In order to solve such problems, a technique has been developed for increasing light emission efficiency by adding an organic metal complex containing a heavy metal (particularly, iridium) to a light-emitting material at about 5 wt % (see Non-patent Document 1). In such a technique, a main constituent is called host, and an organic light-emitting material added is called guest (or dopant). In that technique, as shown in FIG. 2A, a host 202 in a light-emitting layer is evenly doped with organic light-emitting material molecules 201.

Note that when the concentration of an organic light-emitting material is higher than or equal to 10 wt %, light emission from one organic light-emitting material molecule is absorbed by the other organic light-emitting material molecules, which results in a decrease in light emission efficiency (this is called concentration quenching), and thus it is necessary to avoid the concentration of an organic light-emitting material of higher than or equal to 10 wt %.

In this technique, a host molecule in the triplet excited state returns to the ground state by transferring the state to an organic light-emitting material molecule, and conversely the organic light-emitting material molecule receives the excited state from the host molecule and is brought into the triplet excited state. The organic light-emitting material molecule can transit to the ground state from the triplet excited state accompanied by light emission owing to spin-orbit interaction.

REFERENCE

Patent Document

[Patent Document 1] United States Patent Application Publication No. 2011/0001146

Non-Patent Document

[Non-patent Document 1] M. A. Baldo, S. Lamansky, P. E. Burrows, M. E. Thompson, S. R. Forrest, "Very high-efficiency green organic light-emitting devices based on electrophosphorescence", Appl. Phys. Lett., 75 (1999), p. 4.

[Non-patent Document 2] Shengyi Yang, Xiulong Zhang, Yanbing Hou, Zhenbo Deng, and Xurong Xu, "Charge carriers at organic heterojunction interface: Exciplex emission or electroplex emission?", J. Appl. Phys., 101, (2007) 096101.

SUMMARY OF THE INVENTION

However, a substance serving as a host normally has a high transporting property for either electrons or holes but has a poor transporting property for the other. Therefore, in a light-emitting layer, light emission is expected to occur in a region closer to an electrode from which carriers that are less transported by the host are injected. Thus, it is considered that light emission efficiency is lower than it should be.

For example, in the case where a host is a material having an excellent electron-transport property, the hole-transport property of the host is relatively poor. Thus, in a light-emitting layer (EML) including such a host, recombination of holes and electrons and light emission resulting therefrom occur mainly on the anode side as illustrated in FIG. 2B. On the other hand, it is expected that light emission hardly occurs on the cathode side with respect to the middle of the light-emitting layer.

In other words, most part of this light-emitting layer is kept in a state where there are a relatively large number of electrons (or anions) in a region from the cathode to a region where light emission occurs. The number of electrons is small in the vicinity of the anode, because electrons are consumed through light emission. On the other hand, holes (or cations) are localized in the vicinity of the anode, because holes have low mobility.

In addition, the light-emitting layer is evenly doped with the organic light-emitting material molecules. If light emission occurs in a localized portion as mentioned above, the organic light-emitting material molecules in a portion where light emission does not occur are not used at all, whereas the organic light-emitting material molecules in a portion where light emission occurs constantly repeatedly undergo excitation and light emission, which may lead to a situation where the portion where light emission occurs is deficient in the organic light-emitting material molecules. Accordingly, many host molecules return to the ground state through thermal deactivation without being able to transfer the state to organic light-emitting material molecules. Such host molecules cause a decrease in light emission efficiency.

To be brought into an excited state, an organic light-emitting material needs to be subjected to direct recombination process or an energy transfer process. In an energy transfer process, there are two mechanism called Forster mechanism and Dexter mechanism, in each of which, a difference between the following two energy differences, an energy difference between the triplet excited state and the ground state of an organic light-emitting material and an energy difference between the triplet excited state and the ground state of a host, is preferably small because energy transfer occurs with high efficiency.

Note that since a certain period of time is needed for energy transfer, for example, there is a possibility that energy cannot be sufficiently transferred from an excited state having a short lifetime, such as the singlet excited state of the host, to the organic light-emitting material.

Such a small difference between the following two energy differences, the energy difference between the triplet excited state and the ground state of the organic light-emitting material and the energy difference between the triplet excited state and the ground state of the host, also means that after the organic light-emitting material is brought into the triplet excited state, the state is returned to the host in many cases. An example thereof will be described with reference to FIG. 2C. In FIG. 2C, $S0\_h$ indicates an energy level in the ground state of the host; $T1\_h$ indicates an energy level in the triplet excited state of the host; $S1\_h$ indicates an energy level in the singlet excited state of the host; $S0\_g$ indicates an energy level in the ground state of the organic light-emitting material; $T1\_g$ indicates an energy level in the triplet excited state of the organic light-emitting material; and $S1\_g$ indicates an energy level in the singlet excited state of the organic light-emitting material.

The singlet excited state and the triplet excited state of the host are transferred to the triplet excited state of the organic light-emitting material, and the organic light-emitting material returns to the ground state, whereby light emission occurs. In general, energy level in the triplet excited state of the host is set to be higher than energy level in the triplet excited state of the organic light-emitting material. This is in order to prevent transition of the triplet excited state of the organic light-emitting material to the triplet excited state of the host. Accordingly, the difference between the energy level in the triplet excited state of the host and the energy level in the triplet excited state of the organic light-emitting material is preferably larger for this purpose.

If the energy level in the triplet excited state of the organic light-emitting material and the energy level in the triplet excited state of the host are substantially equal, transition of the triplet excited state of the organic light-emitting material to the host may occur by thermal excitation. Needless to say, as a result of this, the host returns from the triplet excited state to the ground state through thermal deactivation (this phenomenon is called quenching).

Note that when the energy level in the triplet excited state of the host is too much higher than the energy level in the triplet excited state of the organic light-emitting material, loss occurs in energy transfer. In contrast, when the energy level in the triplet excited state of the host is equal to the energy level in the triplet excited state of the organic light-emitting material, loss occurs due to quenching. In this manner, in a conventional light-emitting mechanism, there is concern that characteristics cannot be sufficiently brought out.

The thickness of the light-emitting layer is small, at most 100 nm, and it is thus technically difficult to confirm the above-described facts. Therefore, it can be said that even the problems have not been known yet. On the other hand, the present inventors recognized such problems and considered that if the problems could be solved, it would be possible to achieve light emission with higher efficiency than before. In other words, it is an object of the present invention to provide a theory which fundamentally solves such problems as described above and to provide novel EL light-emitting elements based on that theory.

The present invention achieves the objects described above by using light emission at an interface instead of using a method in which light emission is obtained in a relatively wide region. In other words, one embodiment of the present invention is an organic light-emitting layer including a layer of an n-type organic material (an organic material having an electron-transport property higher than a hole-transport property); a layer of a p-type organic material (an organic material having an hole-transport property higher than an electron-transport property); and a layer which contains an organic light-emitting material molecule and is in contact with the layer of the n-type organic material and the layer of the p-type organic material. The number of the molecules (including the organic light-emitting material molecule) in the thickness direction of the layer which contains the organic light-emitting material molecule is one to five.

Another embodiment of the present invention is an organic light-emitting layer including a layer of an n-type organic material, a layer of a p-type organic material, and the layer which contains an organic light-emitting material molecule, has a thickness of 1 nm to 10 nm, and is in contact with the layer of the n-type organic material and the layer of the p-type organic material. Here, the layer which contains the organic light-emitting material molecule may include a molecule of an n-type organic material and a molecule of a p-type organic material. Further, the concentration of an organic light-emitting material molecule is 10 wt % to 50 wt %, preferably, 20 wt % to 50 wt %. The layer which contains the organic light-emitting material molecule can be substantially treated as a film of an organic light-emitting material molecule because the concentration of the organic light-emitting material is higher than that of an organic light-emitting material in a conventional light-emitting layer and the thickness of the layer which contains the organic light-emitting material molecule is small.

In the above, materials of the n-type organic material, the p-type organic material, and the organic light-emitting material may be selected from materials disclosed in Patent Document 1. Needless to say, materials other than the above-described materials can also be used and the materials are not limited to known materials. The organic light-emitting material may be preferably an organic metal complex.

Another embodiment of the present invention is a light-emitting element which includes the above-described light-emitting layer. The light-emitting element may include two or more above-described light-emitting layers. In the case where the light-emitting element includes two or more above-described light-emitting layers, the light-emitting layers may emit light with different emission spectra.

Another embodiment of the present invention is a light-emitting element including the above-described light-emitting layer and a light-emitting layer which emits light by a light-emitting mechanism different from that of the above-described light-emitting layer. The light-emitting element may include two or more above-described light-emitting layers. In the case where the light-emitting element includes two or more above-described light-emitting layers, the light-emitting layers may emit light with different emission spectra. Further, the light-emitting element may include two or more light-emitting layers each of which emits light by a light-emitting mechanism different from that of the above-described light-emitting layers. In the case where the light-emitting element includes two or more light-emitting layers each of which emits light by a light-emitting mechanism different from that of the above-described light-emitting layers, the two or more light-emitting layers may emit light with different emission spectra.

The above-described light-emitting element may further include any of a hole-injection layer, a hole-transport layer, an electron-transport layer, an electron-injection layer, an electron-relay layer, an intermediate layer, and the like. As materials of the light-emitting layer, the hole-injection layer, the hole-transport layer, the electron-transport layer, the electron-injection layer, the electron-relay layer, the intermediate layer, and the like, materials disclosed in Patent Document 1, for example, may be used as appropriate. Needless to say, materials other than the materials disclosed therein can also be used and the materials are not limited to known materials.

Another embodiment of the present invention is a passive-matrix display device, an active-matrix display device, or a lighting device which includes the above-described light-emitting layer. For details of the passive-matrix display device, the active-matrix display device, or the lighting device, Patent Document 1 can be referred to.

FIGS. 1A to 1D are some conceptual diagrams of the present invention. FIG. 1A illustrates a structure of a light-emitting layer 104 in which organic light-emitting material molecules 101 (G) are interposed between a layer 102 of an n-type organic material and a layer 103 of a p-type organic material. FIG. 1B illustrates the light-emitting layer 104 including a layer 105 which contains an organic light-emitting material molecule between the layer 102 of the n-type organic material and the layer 103 of the p-type organic material. The layer 105 which contains the organic light-emitting material molecule has a thickness of 1 nm to 10 nm.

FIG. 1C illustrates a light-emitting element in which the light-emitting layer 104 illustrated in FIG. 1A or FIG. 1B is interposed between an anode 106 and a cathode 107, and FIG. 1D illustrates a light-emitting element which includes, in addition to the above-described components, a hole-injection layer 108, a hole-transport layer 109, an electron-injection layer 110, and an electron-transport layer 111.

A light-emitting phenomenon at an interface between different kinds of organic semiconductors has been observed so far. At this time, light emission from an exciplex or an electroplex is observed (for example, see Non-patent Document 2). In general, the LUMO (Lowest Unoccupied Molecular Orbital) of an n-type organic material and the HOMO (Highest Occupied Molecular Orbital) of a p-type organic material are the LUMO and the the HOMO of such an exciplex, respectively, and light emission due to an energy difference between the LUMO and the HOMO is obtained.

In other words, electrons passing through the layer of the n-type organic material and holes passing through the layer of the p-type organic material are injected to one or both of an n-type organic material molecule and a p-type organic material molecule at an interface between the layer of the n-type organic material and the layer of the p-type organic material, so that the n-type organic material molecule and the p-type organic material molecule at this interface forms an exciplex. Note that in this case, only light emission caused from transition from the singlet excited state to the ground state is allowed, and light emission caused from transition from the triplet excited state is not obtained, which causes low quantum efficiency.

On the other hand, in one embodiment of the present invention, by provision of the layer which contains the organic light-emitting material molecule and has a thickness of one molecule to five molecules, which can emit light (phosphorescence) through the transition from the triplet excited state to the ground state at an interface between the layer of the n-type organic material and the layer of the p-type organic material, quantum efficiency can be increased.

In the above-described structure, the n-type organic material and the p-type organic material are isolated from each other; therefore, the probability of generation of an exciplex therebetween is decreased, and thus electrons passing through the layer of the n-type organic material and holes passing through the layer of the p-type organic material are injected to the organic light-emitting material molecule, so that the organic light-emitting material molecule is brought into the singlet excited state or the triplet excited state.

Such a phenomenon is a kind of the direct recombination process, and in particular, a phenomenon that carriers are directly injected to the organic light-emitting material from the n-type organic material and the p-type organic material is referred to as "guest (organic light-emitting material) coupled with complementary hosts (n-type organic material and the p-type organic material) (GCCH)".

Further, a feature of one embodiment of the present invention is that an energy transfer process, which accounts for most part of a conventional light-emitting mechanism, hardly exists. As described above, in an energy transfer process, energy in the excited n-type or p-type organic materials results in thermal deactivation with a certain ratio; therefore, the organic light-emitting material is preferably less excited due to an energy transfer process.

Further, even if the n-type organic material molecule and the p-type organic material molecule forms an exciplex for some reason, the excited state is transferred to the organic light-emitting material molecule by operation of the organic light-emitting material molecule which adjacently exists, so that light emission can be obtained with high quantum efficiency.

Since a feature of one embodiment of the present invention is that a concentration of an organic light-emitting material of the layer which contains the organic light-emitting material molecule and is provided between the layer of the n-type organic material and the layer of the p-type organic material, is higher than that of an organic light-emitting material in a light-emitting layer of a conventional light-emitting element, the excited state of the exciplex is transferred to the organic light-emitting material molecule immediately.

Note that in the case where holes are injected to the organic light-emitting material molecule first, for example, the organic light-emitting material molecule is charged positively (becomes a cation); therefore, the organic light-emitting material molecule attracts electrons passing through the n-type organic material, which means that the potential of the excited state of the organic light-emitting material molecule is decreased. In this case, the organic light-emitting material molecule (a cation) to which holes are injected and the adjacent n-type organic material molecule (an anion) including electrons may form an exciplex. In a process where the exciplex returns to the ground state, light emission is obtained due to an energy difference between the excited state and the ground state of the organic light-emitting material. For a similar reason, the organic light-emitting material molecule and the p-type organic material molecule may form an exciplex.

Note that in order that the organic light-emitting material molecule in an excited state returns to the ground state, it takes longer than or equal to several microseconds. If a structure in which organic light-emitting material molecules are dispersed into a host is employed like a conventional principle of light emission, when electrons and holes are injected in the vicinity of an organic light-emitting material molecule while the organic light-emitting material molecule is in an excited state, the host molecules are brought into an excited state, and the host molecules undergo thermal deactivation with a certain ratio before the organic light-emitting material molecule returns to the ground state.

Such a phenomenon is observed when overvoltage is applied to a light-emitting layer and overcurrent flows therein. In this case, a host is excited as compared to the case where normal voltage is applied to a light-emitting layer and normal current flows therein, and thermal deactivation is caused, which results in deterioration of the host.

However, as described above, in a structure in which an n-type organic material and a p-type organic material are isolated from each other by a layer which contains an organic light-emitting material molecule, even if the organic light-emitting material molecule interposed therebetween is in an excited state, a probability that electrons passing through the n-type organic material are injected to the p-type organic material or a probability that holes passing through the p-type organic material are injected to the n-type organic material is extremely low. Accordingly, a probability of thermal deactivation is decreased, so that quantum efficiency can be improved.

Note that in this state, electrons remain in the layer of the n-type organic material (on the cathode side) and holes remains in the layer of the p-type organic material (on the anode side), and they cancel external voltage to some degree, so that current supplied to the organic light-emitting material is automatically controlled. In other words, overcurrent can be prevented from being supplied to the organic light-emitting material, the n-type organic material or the p-type organic material, which prevents the organic light-emitting material, the n-type organic material or the p-type organic material from deteriorating.

Further, in one embodiment of the present invention, electrons are injected from the n-type organic material to the LUMO of the organic light-emitting material, and holes are injected from the p-type organic material to the HOMO of the organic light-emitting material, and as described later, even a large difference between energy level in the triplet excited state of the n-type organic material (or the p-type organic material) and energy level in the triplet excited state of the organic light-emitting material, does not result in energy loss.

Therefore, the difference between the energy level in the triplet excited state of the n-type organic material and the energy level in the triplet excited state of the organic light-emitting material can be made sufficiently large. In other words, the probability of the transition of the triplet excited state of the organic light-emitting material to the triplet excited state of the n-type organic material can be extremely low. The transition of the triplet excited state of the organic light-emitting material to the triplet excited state of the p-type organic material can also be made extremely low.

Note that in a light-emitting element having a conventional structure, in order to trap holes and electrons, a hole-injection layer, a hole-transport layer, an electron-injection layer, an electron-transport layer, and the like are provided; however, in one embodiment of the present invention, one or more of them are not necessarily provided. Accordingly, steps of forming these layers can be omitted.

BRIEF DESCRIPTION OF THE DRAWINGS

In the accompanying drawings.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

Figure 3A:
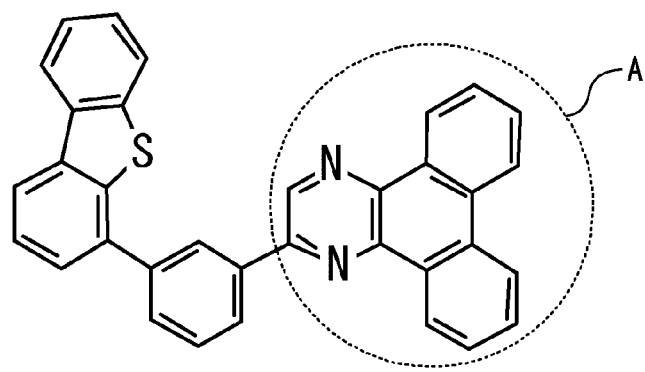
FIGS. 3A to 3C illustrate Embodiment 1.

In this embodiment, examples of an n-type organic material, a p-type organic material, and an organic light-emitting material, which can be used in one embodiment of the present invention, will be described. FIG. 3A shows a structural formula of 2-[3-(dibenzothiophen-4-yl)phenyl]dibenzo[f,h]quinoxaline (abbreviation: 2mDBTPDBq-II) as an example of the n-type organic material.

In general, when a heteroatom (an atom having higher electronegativity than carbon), such as a nitrogen atom, is introduced to constituent atoms of a six-membered aromatic ring such as a benzene ring, the heteroatom attracts a π electron on the ring and the aromatic ring tends to be deficient in electrons. Accordingly, this portion is likely to trap electrons. Heteroaromatic compounds comprising six-membered rings generally tend to serve as n-type organic materials.

Note that the LUMO level and the HOMO level of 2mDBT-PDBq-II are −2.78 eV and −5.88 eV, respectively, and an energy difference between a triplet excited state and a ground state is 2.54 eV.

Figure 3B:
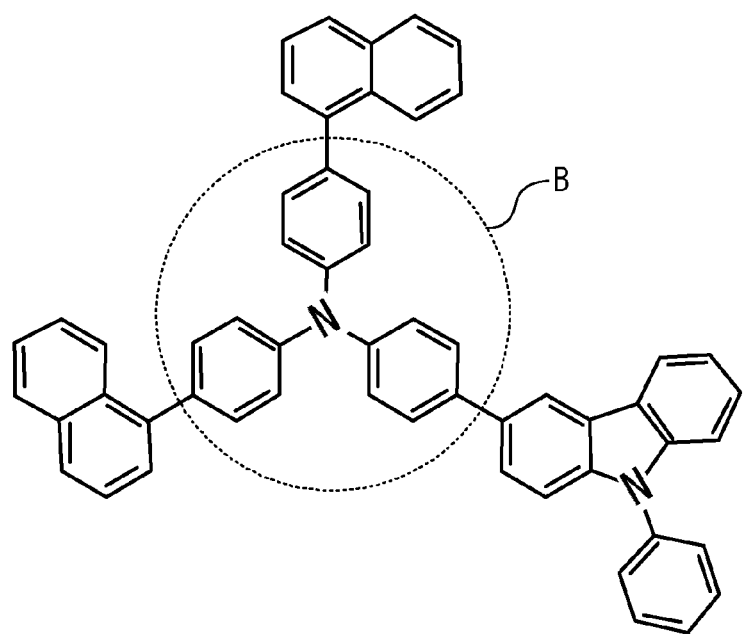

FIG. 3B shows a structural formula of 4,4'-di(1-naphthyl)-4''-(9-phenyl-9H-carbazol-3-yl)triphenylamine (abbreviation: PCBNBB) as an example of the p-type organic material. In general, when a nitrogen atom is located outside an aromatic ring such as a benzene ring and is bound to the ring, the nitrogen atom donates an unshared electron pair to the benzene ring, whereby electrons become excess and tend to be released (i.e., holes are likely to be trapped). In the diagram, a portion B surrounded by a dotted line corresponds to a portion which is in excess of π electrons, and this portion is likely to release electrons (or trap holes). Aromatic amine compounds generally tend to serve as p-type organic materials.

Note that the LUMO level and the HOMO level of PCBNBB are −2.31 eV and −5.46 eV, respectively, and an energy difference between a triplet excited state and a ground state is 2.40 eV.

Figure 3C:
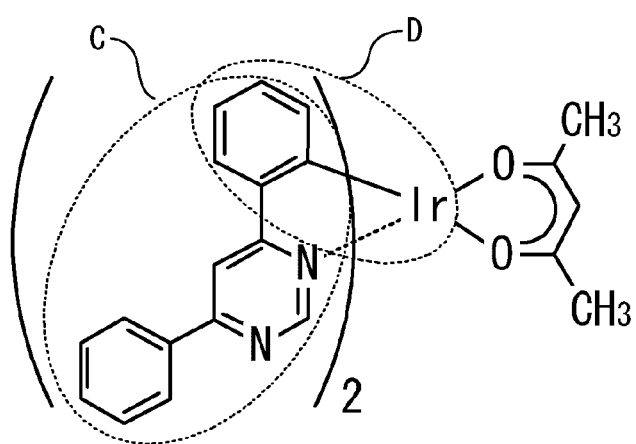

FIG. 3C shows a structural formula of (acetylacetonato)bis(4,6-diphenylpyrimidinato)iridium(III) (abbreviation: [Ir(dppm)$_2$(acac)]) as an example of an organic light-emitting material. In general, iridium complexes form an excited state called metal-to-ligand charge transfer (MLCT) excited state. This is a state in which an electron on an orbital of a metal atom is excited to an orbital of a ligand, which means that the HOMO exists around the metal atom and the LUMO exits around the ligand.

Note that the LUMO level and the HOMO level of [Ir(dppm)$_2$(acac)] are −2.98 eV and −5.56 eV, respectively, and an energy difference between a triplet excited state and a ground state is 2.22 eV.

As illustrated in FIG. 3C, electrons are trapped by a ligand in a portion C surrounded by a dotted line, and holes are trapped by a portion D surrounded by a dotted line which corresponds to a region from a metal atom to the ligand.

Note that as the organic light-emitting material, bis(3,5-dimethyl-2-phenylpyrazinato)(dipivaloylmethanato)iridium(III) (abbreviation: [Ir(mppr-Me)$_2$(dpm)]), bis(2,3,5-triphenylpyrazinato)(dipivaloylmethanato)iridium(III) (abbreviation: [Ir(tppr)$_2$(dpm)]), (acetylacetonato)bis(6-tertbutyl-4-phenylpyrimidinato)iridium(III) (abbreviation: [Ir(tBuppm)$_2$(acac)]), or the like can also be used.

The LUMO level and the HOMO level of [Ir(mppr-Me)$_2$(dpm)] are −2.77 eV and −5.50 eV, respectively, and an energy difference between a triplet excited state and a ground state is 2.24 eV. The LUMO level and the HOMO level of [Ir(tppr)$_2$(dpm)] are −2.28 eV and −5.28 eV, respectively, and the energy difference between the triplet excited state and the ground state is 1.92 eV.

As the n-type organic material, other than 2mDBTPDBq-II described above, for example, any of compounds having an electron-accepting property, such as 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), and 4,4',4''-(1,3,5-benzenetriyl)tri(dibenzothiophene) (abbreviation: DBT3P-II) may be used.

In addition, as the p-type organic material, in addition to PCBNBB described above, a compound having a hole-accepting property, such as 4,4'-bis[N-(1-naphthyl)-N-phenylamino]biphenyl (abbreviation: NPB or α-NPD), 4-phenyl-4'-(9-phenyl-9H-carbazol-3-yl)triphenylamine (abbreviation: PCBA1BP), or 9-phenyl-9H-3-(9-phenyl-9H-carbazol-3-yl)carbazole (abbreviation: PCCP) may be used.

Figure 1A:
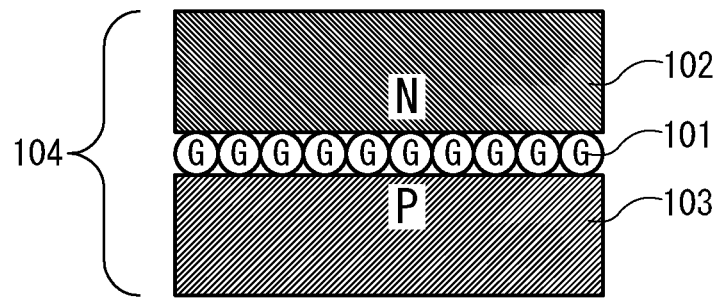
FIGS. 1A to 1D illustrate a variety of embodiments of the present invention.
Figure 1B:
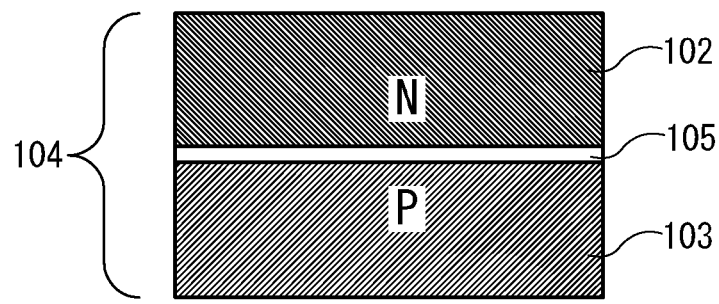
Figure 1C:
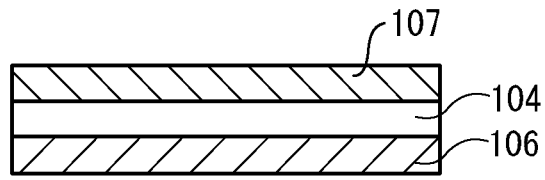
Figure 1D:
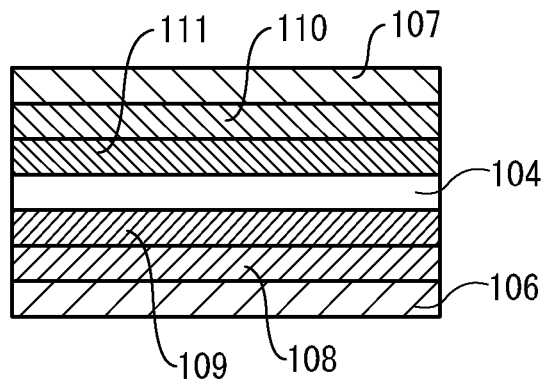
Figure 2A:
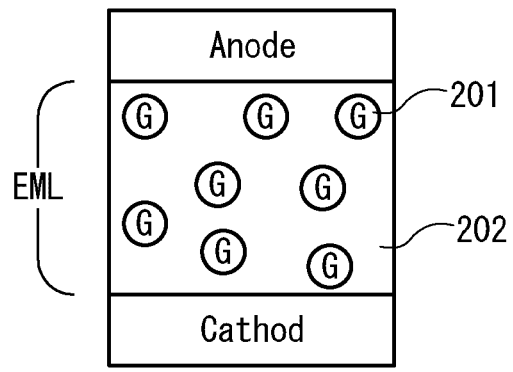
FIGS. 2A to 2C illustrate a conventional light-emitting mechanism.
Figure 2B:
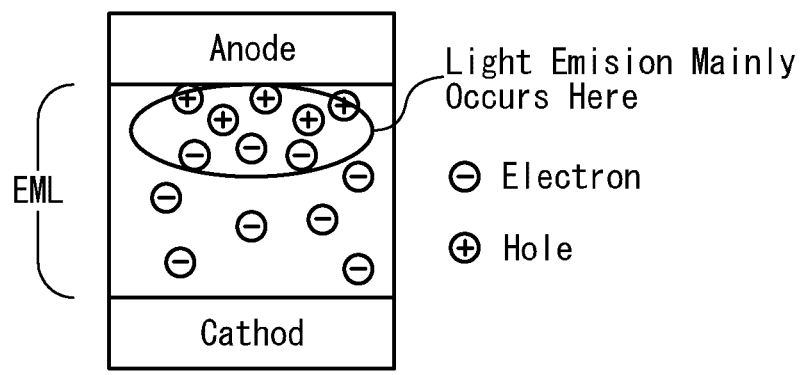
Figure 2C:
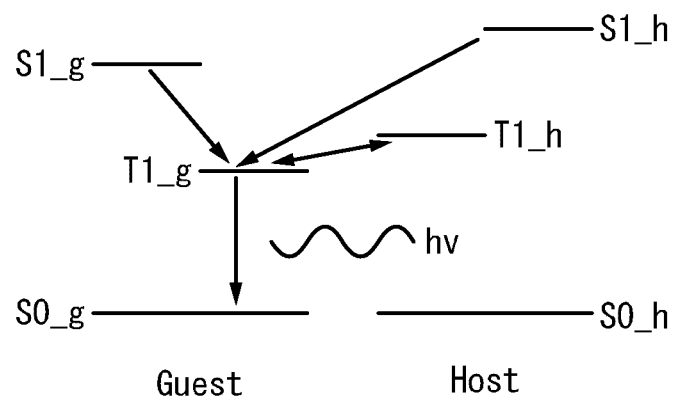

With use of the above-described materials, the layer 102 of the n-type organic material, the layer 103 of the p-type organic material, the organic light-emitting material molecule 101, the layer 105 which contains the organic light-emitting material molecule, and the like, which are illustrated in FIG. 1A or 1B, can be formed. Note that, as described in Embodiment 2, a combination of an n-type organic material, a p-type organic material, and an organic light-emitting material, which are included in the above-described components, is determined in consideration of the HOMO level, the LUMO level, or the like, whereby emission efficiency can be enhanced.

Embodiment 2

Figure 4A:
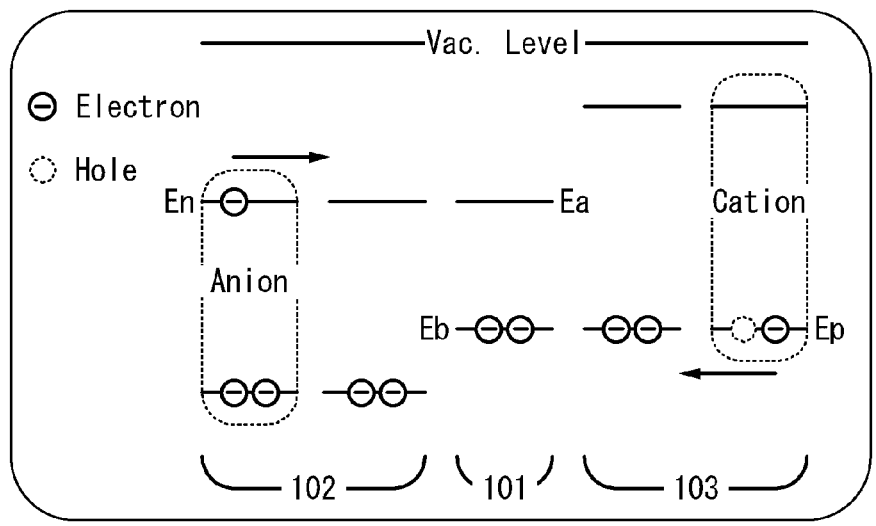
FIGS. 4A to 4C illustrate Embodiment 2.

In this embodiment, a light-emitting mechanism of one embodiment of the present invention will be described with reference to FIGS. 4A to 4C. FIG. 4A shows a state in which electrons and holes injected from a cathode and an anode pass through the layer 102 of the n-type organic material and the layer 103 of the p-type organic material, respectively, and approach a monomolecular film of an organic light-emitting material (the organic light-emitting material molecule 101). Here, a left molecule of molecules included in the layer 102 of the n-type organic material is an anion, and a right molecule of molecules included in the layer 103 of the p-type organic material is a cation.

The relation between the LUMO level En (eV) of the n-type organic material and the LUMO level Ea (eV) of the organic light-emitting material is preferably En−0.5<Ea<En+0.5. The relation between the HOMO level Ep (eV) of the p-type organic material and the HOMO level Eb (eV) of the organic light-emitting material is preferably Ep−0.5<Eb<Ep+0.5. Note that Ea is higher than Eb. In FIGS. 4A and 4B, Ea is equal to En, and Eb is equal to Ep.

Further, the energy difference between the HOMO level and the LUMO level of the n-type organic material is preferably higher than the energy difference between the HOMO level and the LUMO level of the organic light-emitting material by higher than or equal to 0.5 eV. The energy difference between the HOMO level and the LUMO level of the p-type organic material is preferably higher than the energy difference between the HOMO level and the LUMO level of the organic light-emitting material by higher than or equal to 0.5 eV.

Under such conditions, the energy difference between the triplet excited state and the ground state of the n-type organic material and the energy difference between the triplet excited state and the ground state of the p-type organic material are larger than that of the organic light-emitting material.

Figure 4B:
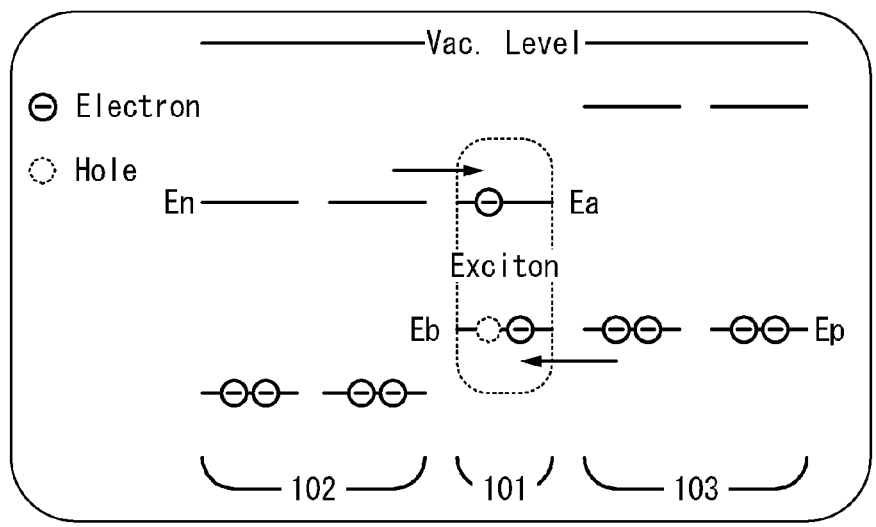

FIG. 4B shows a state in which an electron passing through the layer 102 of the n-type organic material and a hole passing through the layer 103 of the p-type organic material are injected to the LUMO and the HOMO of the organic light-emitting material molecule, respectively. Thus, the organic light-emitting material molecule is brought into the triplet excited state (becomes an exciton) and emits light.

It is to be noted here that since the energy level in the triplet excited state of the organic light-emitting material is sufficiently lower than the energy levels in the triplet excited states of the n-type organic material and the p-type organic material, transition of the triplet excited state of the organic light-emitting material to the n-type organic material or the p-type organic material hardly occurs. It will be described with reference to FIG. 4C.

Figure 4C:
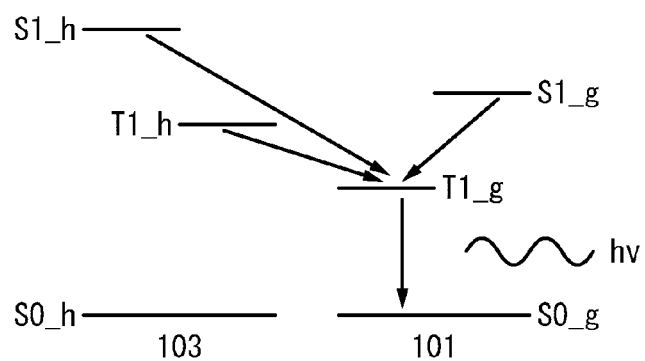

In FIG. 4C, S0_h indicates an energy level in the ground state of the n-type or p-type organic material; T1_h indicates an energy level in the triplet excited state of the n-type or p-type organic material; S1_h indicates an energy level in the singlet excited state of the n-type or p-type organic material; S0_g indicates an energy level in the ground state of the organic light-emitting material; T1_g indicates an energy level in the triplet excited state of the organic light-emitting material; and S1_g indicates an energy level in the singlet excited state of the organic light-emitting material.

The organic light-emitting material is brought into the triplet excited state mainly through the direct recombination process (GCCH), and the excited state of the n-type organic material or the p-type organic material does not relate to the process where the organic light-emitting material is brought into the triplet excited state. Accordingly, it is not necessary to consider an energy transfer process from the n-type organic material or the p-type organic material to the organic light-emitting material. Therefore, the organic light-emitting material can be excited with high efficiency.

Further, since it is not necessary to consider the energy transfer process, the difference between the energy levels of the triplet excited state of the organic light-emitting material and the triplet excited state of the n-type organic material (or the p-type organic material) can be made large. Therefore, the probability of transition of the triplet excited state of an organic light-emitting material molecule to the triplet excited state of an n-type (or p-type) organic material molecule is extremely low after the organic light-emitting material molecule is brought into the triplet excited state, which is preferable for higher efficiency.

This application is based on Japanese Patent Application serial no. 2011-041233 filed with the Japan Patent Office on Feb. 28, 2011, the entire contents of which are hereby incorporated by reference.

What is claimed is:
1. An organic light-emitting layer comprising:
a layer of an n-type organic material;
a layer of a p-type organic material; and
a monomolecular film consisting of an organic metal complex containing iridium, wherein the monomolecular film is interposed between the layer of the n-type organic material and the layer of the p-type organic material, wherein the difference between the lowest unoccupied molecular orbit level of the n-type organic material and the lowest unoccupied molecular orbit level of the organic light-emitting material is less than 0.5 eV, and wherein the difference between the highest occupied molecular orbit level of the p-type organic material and the highest occupied molecular orbit level of the organic light-emitting material is less than 0.5 eV.

2. A light-emitting element comprising the organic light-emitting layer according to claim 1.

3. The light-emitting element according to claim 2, comprising two or more organic light-emitting layers.

4. The light-emitting element according to claim 3, wherein the organic light-emitting layers emit light with different emission spectra.

5. The light-emitting element according to claim 2, comprising at least one of a hole-injection layer, a hole-transport layer, an electron-transport layer, an electron-injection layer, an electron-relay layer, and an intermediate layer.

6. The light-emitting element according to claim 2, wherein the light-emitting element is incorporated in one selected from the group consisting of a lighting device, a passive matrix display device and an active matrix display device.

7. A light-emitting element comprising:
an anode;
a cathode;
a layer of an n-type organic material;
a layer of a p-type organic material; and
a monomolecular film consisting of an organic metal complex containing iridium,
wherein the monomolecular film is interposed between the layer of the n-type organic material and the layer of the p-type organic material,
wherein the layer of the n-type organic material is interposed between the cathode and the monomolecular film of the organic light-emitting material,
wherein the layer of the p-type organic material is interposed between the anode and the monomolecular film of the organic light-emitting material,
wherein the difference between the lowest unoccupied molecular orbit level of the n-type organic material and the lowest unoccupied molecular orbit level of the organic light-emitting material is less than 0.5 eV, and
wherein the difference between the highest occupied molecular orbit level of the p-type organic material and the highest occupied molecular orbit level of the organic light-emitting material is less than 0.5 eV.

8. The light-emitting element according to claim 7, wherein the light-emitting element comprises two or more organic light emitting layers, and wherein the emission spectrum of one of the organic light emitting layers is different from that of the other of the organic light emitting layers.

9. The light-emitting element according to claim 7, comprising at least one of a hole-injection layer, a hole-transport layer, an electron-transport layer, an electron-injection layer, an electron-relay layer, and an intermediate layer.

10. The light-emitting element according to claim 7, wherein the light-emitting element is incorporated in one selected from the group consisting of a lighting device, a passive matrix display device and an active matrix display device.

11. The light-emitting element according to claim 7, wherein both of an energy level of the triplet excited state of the n-type organic material and an energy level of the triplet excited state of the p-type organic material is larger than an energy level of the triplet excited state of the organic light-emitting material.

12. An organic light-emitting layer comprising:
a first layer comprising an n-type organic material;
a second layer comprising a p-type organic material; and
a monomolecular film consisting of an organic metal complex containing iridium,
wherein the monomolecular film is interposed between the first layer and the second layer,
wherein the difference between the lowest unoccupied molecular orbit level of the n-type organic material and the lowest unoccupied molecular orbit level of the organic light-emitting material is less than 0.5 eV, and
wherein the difference between the highest occupied molecular orbit level of the p-type organic material and the highest occupied molecular orbit level of the organic light-emitting material is less than 0.5 eV.

13. A light-emitting element comprising the organic light-emitting layer according to claim 12.

14. The light-emitting element according to claim 13, comprising two or more organic light-emitting layers.

15. The light-emitting element according to claim 14, wherein the organic light-emitting layers emit light with different emission spectra.

16. The light-emitting element according to claim 13, comprising at least one of a hole-injection layer, a hole-transport layer, an electron-transport layer, an electron-injection layer, an electron-relay layer, and an intermediate layer.

17. The light-emitting element according to claim 13, wherein the light-emitting element is incorporated in one selected from the group consisting of a lighting device, a passive matrix display device and an active matrix display device.

* * * * *